(12) United States Patent
Graham et al.

(10) Patent No.: US 11,184,995 B2
(45) Date of Patent: Nov. 23, 2021

(54) HIGH-DENSITY NETWORK ELEMENT COOLING VIA UNEQUIPPED PLUGGABLE OPTICAL MODULE CAGES

(71) Applicant: Ciena Corporation, Hanover, MD (US)

(72) Inventors: Terence Arthur Graham, Manotick (CA); Bonnie Lynne Mack, Carp (CA); Michael Reginald Bishop, Nepean (CA); Simon John Shearman, Almonte (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/671,590

(22) Filed: Nov. 1, 2019

(65) Prior Publication Data

US 2021/0136951 A1    May 6, 2021

(51) Int. Cl.
*H05K 7/20* (2006.01)
*G02B 6/44* (2006.01)

(52) U.S. Cl.
CPC ....... *H05K 7/20145* (2013.01); *G02B 6/4452* (2013.01); *H05K 7/20* (2013.01); *H05K 7/20181* (2013.01); *H05K 7/20736* (2013.01)

(58) Field of Classification Search
CPC .................................................. G02B 6/4452
See application file for complete search history.

(56) References Cited

U.S. PATENT DOCUMENTS

| | | |
|---|---|---|
| 3,874,444 A | 4/1975 | Perce et al. |
| 4,837,663 A | 6/1989 | Zushi et al. |
| 5,136,464 A | 8/1992 | Ohmori |
| 5,995,368 A | 11/1999 | Lee et al. |
| 6,698,079 B1 | 3/2004 | Mimlitch, III et al. |
| 6,972,949 B1 | 12/2005 | Helgenberg et al. |
| 7,126,820 B2 | 10/2006 | Wei |
| 7,184,267 B2 | 2/2007 | Patel |
| 7,259,961 B2 | 8/2007 | Lucero et al. |
| 7,420,806 B1 | 9/2008 | Lima et al. |
| 7,447,020 B2 | 11/2008 | Xia et al. |
| 7,633,754 B1 | 12/2009 | Mumper |
| 7,701,710 B2 | 4/2010 | Tanaka et al. |
| 7,864,519 B2 | 1/2011 | Lin et al. |
| 7,933,120 B2 | 4/2011 | Tanaka et al. |
| 7,957,133 B2 | 6/2011 | Zieman et al. |

(Continued)

FOREIGN PATENT DOCUMENTS

WO       2010022597 A1    3/2010

*Primary Examiner* — Mukundbhai G Patel
(74) *Attorney, Agent, or Firm* — Clements Bernard Baratta; Lawrence A. Baratta, Jr.; Christopher L. Bernard

(57) ABSTRACT

A platform includes a housing with a front side, a rear side opposite the front side, a right side adjacent to both the front side and the rear side, and a left side opposite the right side and adjacent to both the front side and the rear side, wherein airflow in the platform is between the front side and the rear side or between the front side and the front side; one or more modules in the housing each including a plurality of cages supporting removable interface cards, wherein the airflow includes an air path that is over the one or more modules between a bottom portion of the one or more modules and a top portion of the one or more modules; and at least one dust cap in one of the plurality of cages, wherein the dust cap includes an air filter medium enabling airflow at an intermediate point of the air path.

20 Claims, 13 Drawing Sheets

(56) References Cited

U.S. PATENT DOCUMENTS

| | | |
|---|---|---|
| 8,154,867 B2 | 4/2012 | Shearman et al. |
| 8,446,725 B2 | 5/2013 | Lam et al. |
| 8,737,067 B1 | 5/2014 | Kim et al. |
| 8,755,192 B1 | 6/2014 | Schrempp et al. |
| 9,769,959 B2 * | 9/2017 | Mayenburg ............. H04L 49/10 |
| 9,788,461 B2 | 10/2017 | Van Gaal |
| 10,761,281 B1 * | 9/2020 | Gupta .................. G02B 6/3897 |
| 2004/0032722 A1 | 2/2004 | Wrycraft et al. |
| 2005/0073809 A1 | 4/2005 | Chang |
| 2005/0078449 A1 | 4/2005 | Makooi et al. |
| 2007/0258211 A1 | 5/2007 | Sonobe et al. |
| 2007/0223201 A1 | 9/2007 | Fujiya et al. |
| 2008/0186668 A1 | 8/2008 | Naufel et al. |
| 2008/0192454 A1 | 8/2008 | Knutsson |
| 2011/0182030 A1 | 7/2011 | Mayer |
| 2011/0222241 A1 | 9/2011 | Shearman et al. |
| 2013/0100610 A1 | 4/2013 | Schneider et al. |

\* cited by examiner

HIGH-DENSITY NETWORK ELEMENT COOLING VIA UNEQUIPPED PLUGGABLE OPTICAL MODULE CAGES

FIELD OF THE DISCLOSURE

The present disclosure generally relates to networking hardware. More particularly, the present disclosure relates to systems and methods for high-density network element cooling via unequipped pluggable optical module cages, such as with a dust cap enabling air flow through the unequipped pluggable optical module cages or a heatsink insert for insertion into the unequipped pluggable optical module cages.

BACKGROUND OF THE DISCLOSURE

Networks, data centers, cloud computing, and the like continues to grow. Equipment manufacturers must continue to deliver substantial continuous reductions in per-bit metrics related to cost, space, and power. Telecommunication, data communication, high-performance computing, and the like systems are typically deployed in physical hardware shelves, chassis, rack-mounted units ("pizza boxes"), cabinets, etc. that are mounted in racks or frames, freestanding, or the like. For example, typical racks or frames are either 19, 21, or 23 inches in practice. Various standards associated with racks or frames are described by Telecordia's GR-63-CORE, "NEBS Requirements: Physical Protection" (April 2012), European Telecoms Standards Institute (ETSI), American National Standard Institute (ANSI), etc. One downside to the continual improvement in the per-bit metrics is the increased heat, i.e., power dissipation, and the corresponding cooling requirements (such as specified in the NEBS standards, note NEBS stands for Network Equipment-Building System). Even further, network operators want to deploy frames in data centers, telecom central offices, etc. as densely as possible, even further limiting cooling techniques, i.e., constraining airflow between the front and back.

In optical communications equipment, it is getting increasingly harder to cool the pluggable devices. In many situations, an array of pluggable optics ports (e.g., pluggable optical module cages) exists which can accomplish different transmission rates. Some pluggable ports can support a range of rates. For example, in a situation where these ports can achieve either 100 Gb/s, 200 Gb/s, or 400 Gb/s, the heat generated by each optical plug generally increases with transmission rate and transmission reach. In many situations when higher transmission rates are used on the port, adjacent ports may not need to be populated. For instance, one can achieve 400 Gb/s total transmission with a single port or with 2×200 Gb/s ports, or 4×100 Gb/s ports.

BRIEF SUMMARY OF THE DISCLOSURE

In an embodiment, a platform includes a housing with a front side, a rear side opposite the front side, a right side adjacent to both the front side and the rear side, and a left side opposite the right side and adjacent to both the front side and the rear side, wherein airflow in the housing is between the front side and the rear side or between the front side and the front side; one or more modules in the housing each including a plurality of cages supporting removable interface cards, wherein the airflow includes an air path that is over the one or more modules between a bottom portion of the one or more modules and a top portion of the one or more modules; and at least one dust cap and heatsink insert in one of the plurality of cages, wherein the dust cap includes an air filter medium enabling airflow at an intermediate point of the air path and the heatsink insert includes. The at least one dust cap includes a front cover portion housing the air filter medium; and a body that extends from the front cover portion into the corresponding cage as would an interface card. The body can include a plurality of openings to direct air to a heatsink. The removable interface cards can be pluggable optical modules. The at least one dust cap can be selectively removable. The at least one dust cap can be replaceable on a schedule that is consistent with a replacement schedule for air filters in the platform. The interface cards can be deployed in the plurality of cages according to a deployment plan specifying which cages are unequipped with a corresponding dust cap. The deployment plan can include placing high power interface cards in one location of the plurality of cages and low power interface cards at another location of the plurality of cages. The deployment plan can include placing interface cards in every other cage with the at least one dust cap in the other cages.

In another embodiment, a module system includes a printed circuit board; a plurality of cages disposed on the printed circuit board, wherein each cage supports a removable interface card; wherein the printed circuit board is configured to be inserted or housed in a housing with a front side, a rear side opposite the front side, a right side adjacent to both the front side and the rear side, and a left side opposite the right side and adjacent to both the front side and the rear side, wherein airflow in the housing is between the front side and the rear side or between the front side and the front side; wherein the airflow includes an air path that is over the printed circuit board between a bottom portion of the printed circuit board and a top portion of the printed circuit board; and at least one dust cap in one of the plurality of cages, wherein the dust cap includes an air filter medium enabling airflow at an intermediate point of the air path. The at least one dust cap can include a front cover portion housing the air filter medium; and a body that extends from the front cover portion into the corresponding cage as would an interface card. The body can include a plurality of openings to direct air to a heatsink. The removable interface card can be a pluggable optical module. The at least one dust cap can be selectively removable. The at least one dust cap can be replaceable on a schedule that is consistent with a replacement schedule for air filters in the platform. Interface cards can be deployed in the plurality of cages according to a deployment plan specifying which cages are unequipped with a corresponding dust cap. The deployment plan can include placing high power interface cards in one location of the plurality of cages and low power interface cards at another location of the plurality of cages. The deployment plan can include placing interface cards in every other cage with the at least one dust cap in the other cages.

In a further embodiment, a method includes deploying a module in a housing associated with a platform, wherein the housing has a front side, a rear side opposite the front side, a right side adjacent to both the front side and the rear side, and a left side opposite the right side and adjacent to both the front side and the rear side, wherein airflow in the housing is between the front side and the rear side or between the front side and the front side; deploying one or more interface cards in corresponding cages of a plurality of cages on the module, wherein the airflow includes an air path that is over the module between a bottom portion of the module and a top portion of the module; and deploying at least one dust cap in one of the plurality of cages, wherein the dust cap includes an air filter medium enabling airflow at an intermediate point of the air path. The method can further include replacing the at least one dust cap with a new dust cap.

BRIEF DESCRIPTION OF THE DRAWINGS

The present disclosure is illustrated and described herein with reference to the various drawings, in which like reference numbers are used to denote like system components/method steps, as appropriate, and in which:

FIG. 1 is a front perspective diagram of the platform, FIG. 2 is a front view of the platform, FIG. 3 is a rear perspective diagram of the platform, and FIG. 4 is an internal cross-sectional diagram of the platform.

DETAILED DESCRIPTION OF THE DISCLOSURE

Figure 1:
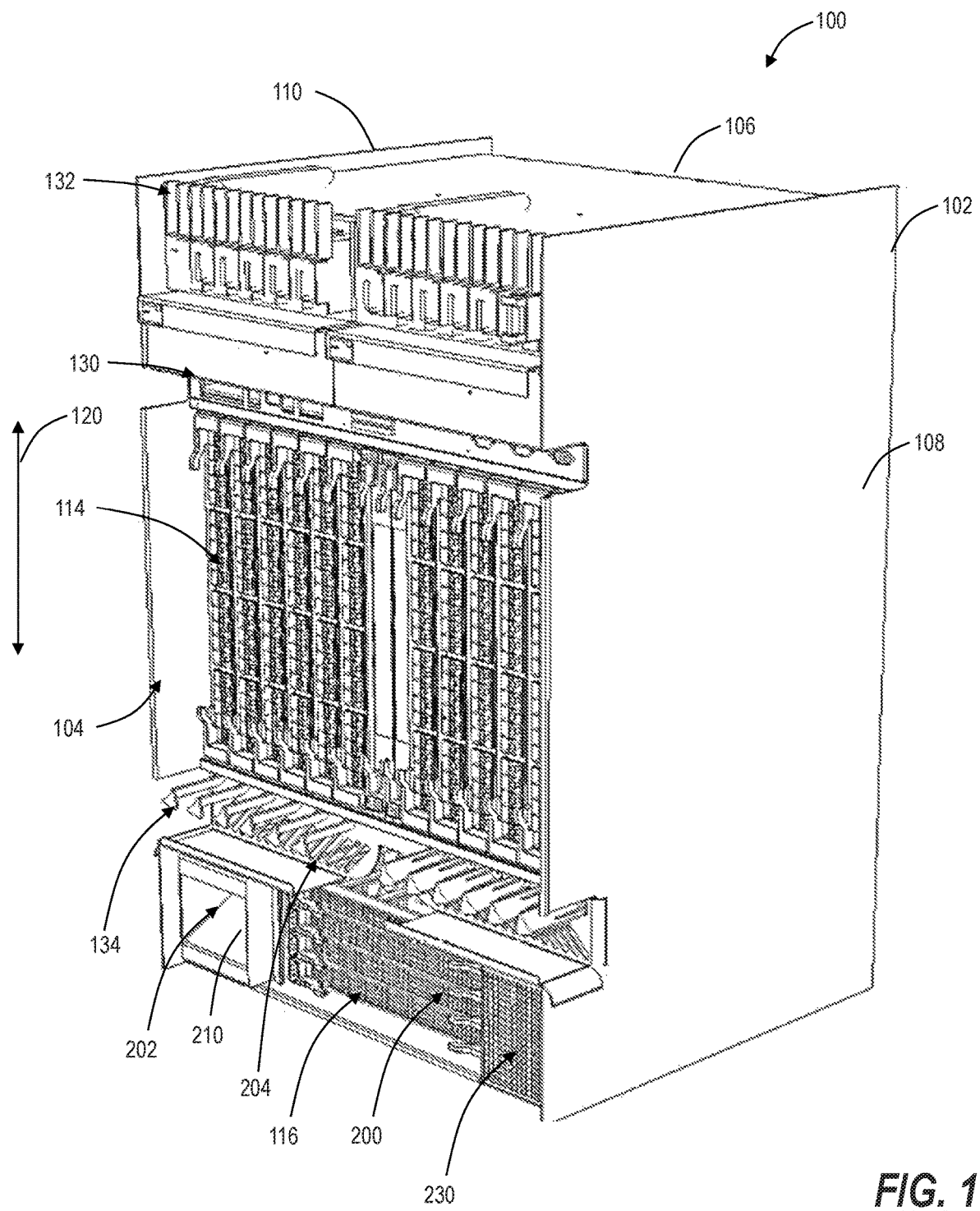
FIGS. 1-4 are various perspective diagrams of a platform.

The present disclosure relates to systems and methods for high-density network element cooling via unequipped pluggable optical module cages, such as with a dust cap enabling air flow through the unequipped pluggable optical module cages or a heatsink insert for insertion into the unequipped pluggable optical module cages. There has not been an easy way to install a filter on the faceplate of NEBS compliant telecom equipment due to space constraints, Electromagnetic Interference (EMI) constraints, and ease of replacement. The present disclosure uses a region of the faceplate that already has a hole in it, namely openings for pluggable optical modules, and uses a dust cap in unequipped slots that enables filtered airflow. The ingress of the air can be tuned by increasing the amount of filter material in the dust cap. Also, it is easily replaced once the filter is too dirty to function properly.

The present disclosure is used in a telecom, networking, compute, and/or storage device such as a chassis, shelf, system, platform, rack-mounted unit, pizza-box, etc. (collectively referred to herein as a platform). The platform preferably has airflow from front to back (or back to front) where the air intake is at one point, and the airflow moves up or down to an opposite point. Assume, for example, ingress air is at the front on a bottom side, and egress air is at the back on a top side. Components at the bottom side are referred to as "upstream" and receive the coolest air. Conversely, components at the top side are referred to as "downstream" and receive already heated air from the upstream components. As described herein, the terminology "upstream" and "downstream" refer to components in terms of the airflow, similar to a stream of water. The dust cap described herein allows the intake of air at different points to allow downstream components to receive cooler air.

Also, the present disclosure utilizes various terms in the art such as module and card. Those of ordinary skill in the art will recognize these terms may be used interchangeably. Further, these do not require removability. That is, a module or card may be fixed in a platform. On the other hand, an interface card or a pluggable module (again these terms may be used interchangeably) is selectively removable from a cage, slot, etc. in the platform. Also, the term platform is used herein to denote a hardware device housing the modules or cards. The platform may include a shelf, chassis, rack-mounted unit, "pizza box," etc.

Advantageously, the dust cap and approach described herein enables filtered, cool air ingress from a front side of a network platform, via unequipped pluggable optical modules. This approach meets relevant specifications such as NEBS GR-63-CORE with respect to filtering, EMI constraints, etc. The dust cap includes mechanisms to limit air leakage based on different applications. The present disclosure includes air ingress, thereby improving cooling in a hardware system, and one advantage includes a reduction in heatsink size requirement, such as on downstream modules. Heatsink size is a critical constraint.

Figure 2:
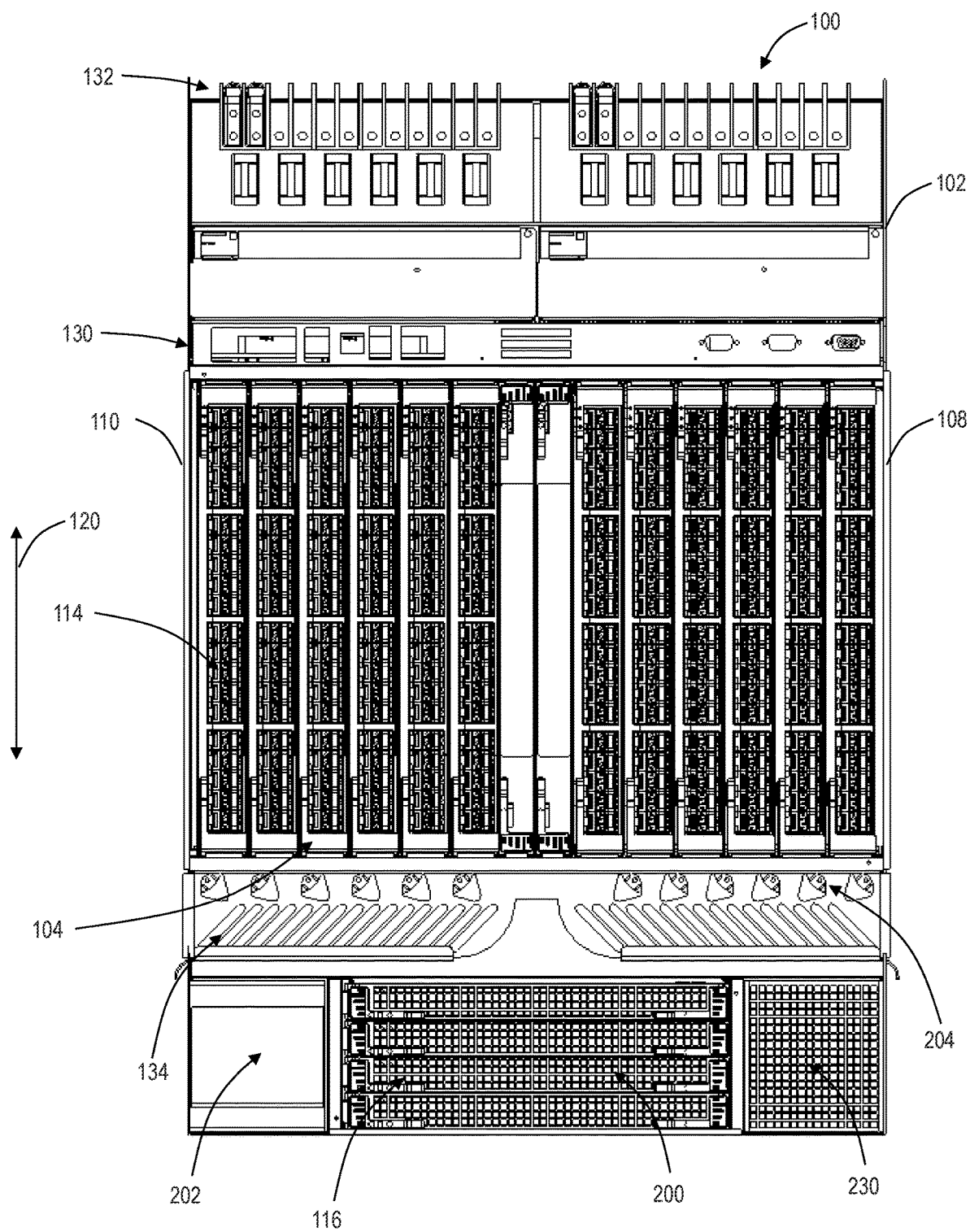
Figure 3:
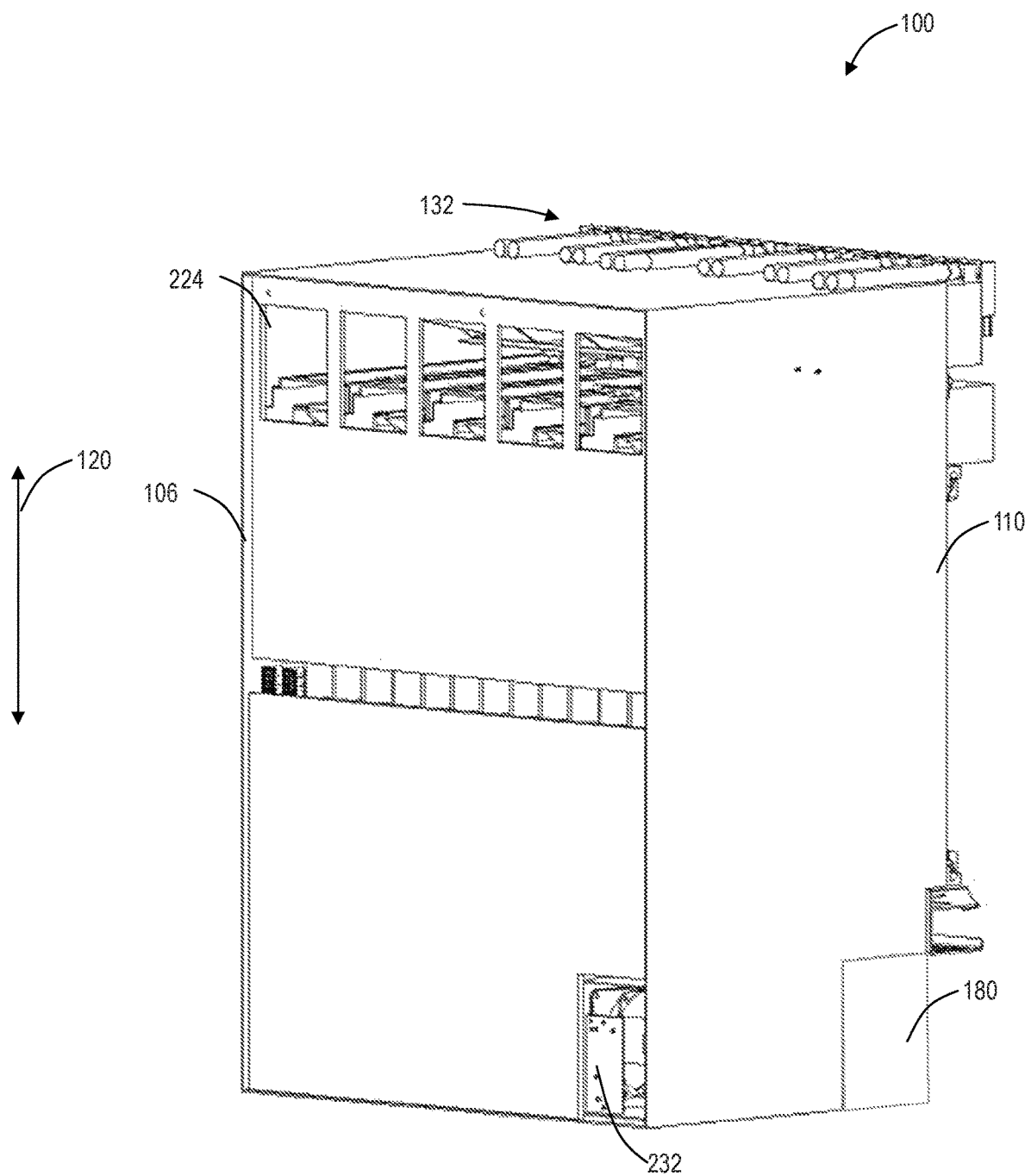
Figure 4:
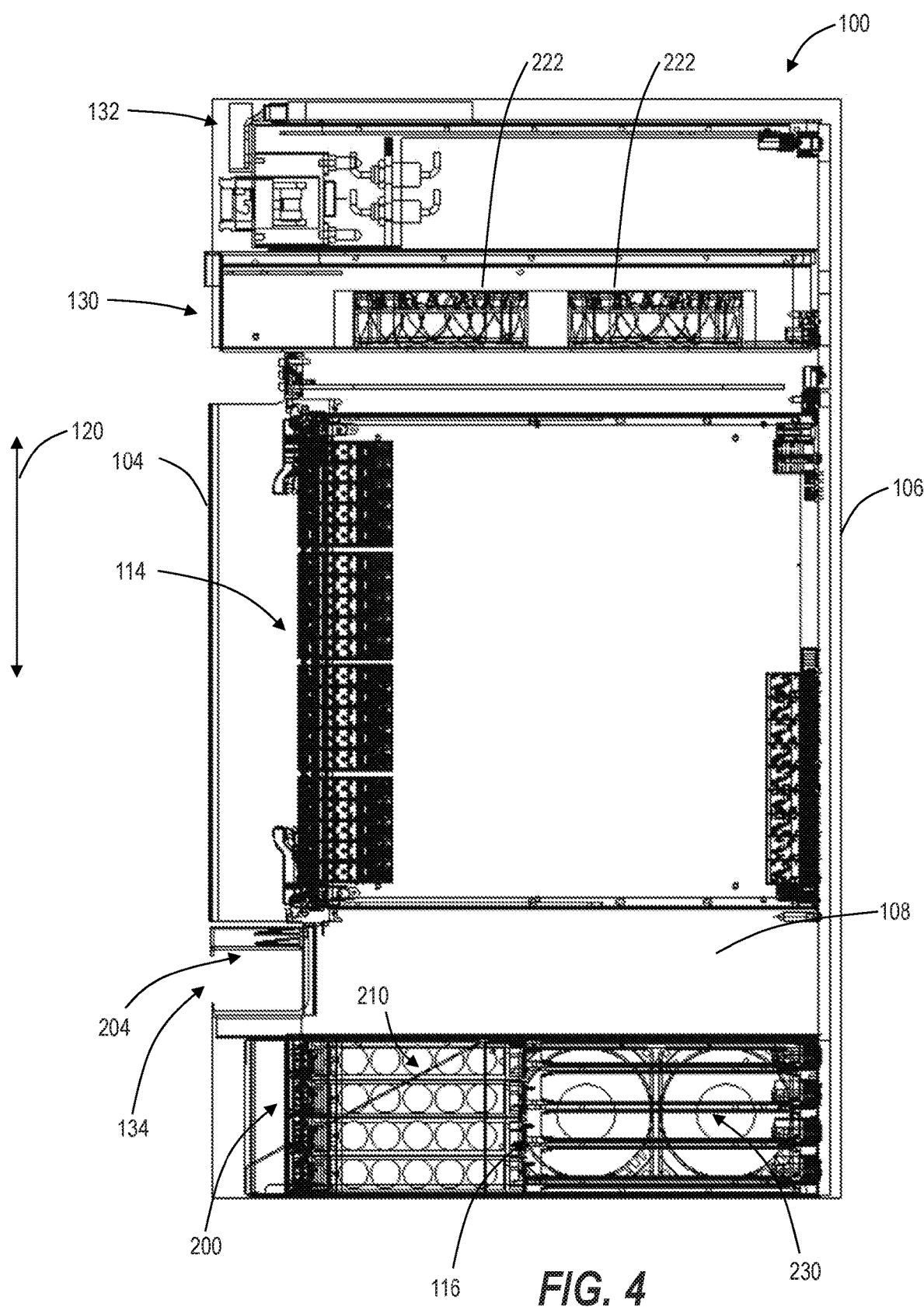

FIGS. 1-4 are various perspective diagrams of a platform 100. FIG. 1 is a front perspective diagram of the platform 100, FIG. 2 is a front view of the platform 100, FIG. 3 is a rear perspective diagram of the platform 100, and FIG. 4 is an internal cross-sectional diagram of the platform 100. FIGS. 1-4 are from commonly-assigned U.S. Pat. No. 9,769,959, issued Sep. 19, 2017, and entitled "HIGH DENSITY NETWORKING SHELF AND SYSTEM," the contents of which are incorporated herein by reference. The platform 100 can be a shelf, a system, etc. forming a network element, a node, etc. in a network. The platform 100 can include front and rear air intake/exhaust without side ventilation, thereby maintaining NEBS compliance. Additionally, the platform 100 is a half-rack system that is scalable to a double (full rack) sized system. The platform 100 is presented as an example for illustration purposes. Those skilled in the art will recognize other physical embodiments are contemplated. That is, the present disclosure contemplates use with any hardware platform having pluggable modules that are unequipped and can provide air ingress using the dust cap described herein.

In an embodiment, the platform 100 can be a network element that may consolidate the functionality of a Multi-Service Provisioning Platform (MSPP), Digital Cross-Connect (DCS), Ethernet and/or Optical Transport Network (OTN) switch, Dense Wave Division Multiplexing (DWDM) platform, etc. into a single, high-capacity intelligent switching system providing Layer 0, 1, and 2 consolidation. In another exemplary embodiment, the platform 100 can be any of an OTN Add/Drop Multiplexer (ADM), a SONET/SDH/OTN ADM, a MSPP, a DCS, an optical cross-connect, an optical switch, a router, a switch, a DWDM terminal, wireless backhaul terminal, an access/aggregation device, etc. That is, the platform 100 can be any digital and/or optical system with ingress and egress signals and switching therebetween of channels, timeslots, tributary units, packets, etc. utilizing OTN, SONET, SDH, Ethernet, IP, etc. In another embodiment, the platform 100 can be a high-rate Ethernet switch. In a further embodiment, the platform 100 can be a DWDM terminal. In yet another embodiment, the platform 100 can be a compute, wireless, storage, or another type of hardware platform. The key aspect of the platform 100 with the present disclosure and any other platform are the front faceplate openings, via interface cards 114 in a cage.

The platform 100 includes a housing 102 which can refer to any shelf, rack, cabinet, case, frame, chassis, or other apparatus used to arrange and/or support a plurality of electronic/optical components such as removable cards, including modules 302 with interface cards 114 and switch fabric cards 116. The housing 102 may be metal, plastic, or combination, or other suitable material and similar in construction to other housings, cabinets and/or racks used to hold electronic/optical components in place. Further, the housing 102 may be rack mounted in an ETSI, ANSI, etc. compliant rack or frame, as well as being deployed in a cabinet, etc. The housing 102 has a front side 104, a rear side 106 opposite the front side 104, a right side 108 adjacent to both the front side 104 and the rear side 106, and a left side 110 opposite the right side and adjacent to both the front side 104 and the rear side 106. Airflow in the platform 100 is between the front side 104 and the rear side 106; there may be no airflow through or between the sides 108, 110.

The housing 102 supports a set of interface cards 114 and, optionally, a set of switch fabric cards 116. The interface cards 114 are arranged in a first direction 120. The switch fabric cards 116 are arranged substantially orthogonally, i.e., perpendicular, to the first direction 120. In this embodiment, the interface cards 114 are vertically aligned, and the switch fabric cards 116 are horizontally aligned. The cards 114, 116 may optionally be surrounded by a separate metallic Faraday Cage including, for example, a metal mesh screen. The orthogonal arrangement of the switch fabric cards 116 as compared with the interface cards 114 can form the recessed portion 40 as described herein.

The interface cards 114 can include selectively inserted pluggable optical transceivers (can also be called pluggable electro-optical transceivers. Again, the interface cards 114 can be referred to as line cards, line blades, I/O modules, etc. and can include a plurality of optical modules in the front. For example, the optical modules can be pluggable modules such as, without limitation, XFP, SFP, XENPAK, X2, CFP, CFP2, CFP4, QSFP, QSFP+, QSFP28, OSFP, QSFP-DD, etc. Further, the interface cards 114 can include a plurality of optical connections per module. The interface cards 114 can include wavelength division multiplexing interfaces, short-reach interfaces, and the like, and can connect to other interface cards 114 on remote network elements, end clients, edge routers, and the like.

From a logical perspective, the interface cards 114 provide ingress and egress ports to the platform 100, and each interface card 114 can include one or more physical ports. The optional switch fabric cards 116 are configured to switch channels, timeslots, tributary units, packets, cells, etc. between the interface cards 114. The interface cards 114 and/or the switch fabric cards 116 can include redundancy as well, such as 1:1, 1:N, etc. In an embodiment, the high density platform 100 can be 15-16 RU with 12 slots for line modules housing the interface cards 114 and 4 slots for the switch fabric cards 116. Here, the high density platform 100 can dissipate between 600-750 W. Further, the switch fabric cards 116 can be single fabric or double fabric (with additional pins to the backplane from the single fabric). Additionally, the platform 100 contemplates operation in an ETSI, ANSI, 19", or 23" rack or frame.

The platform 100 can include common equipment 130, power connections 132, and a fiber manager 134. The common equipment 130 is utilized for Operations, Administration, Maintenance, and Provisioning (OAM&P) access; user interface ports; and the like. The platform 100 can include an interface for communicatively coupling the common equipment 130, the interface cards 114, and the switch fabric cards 116 therebetween. For example, the interface can be a backplane, midplane, a bus, optical or electrical connectors, or the like. The interface cards 114 are configured to provide ingress and egress to the platform 100.

Airflow is confined to the front side 104 and the rear side 106, thereby maintaining NEBS compliance. There may be no vents or openings for airflow on the sides 108, 110. The platform 100 can include two separate airflow paths—a first air path for the interface cards 114 and a second air path for the switch fabric cards 116. The first air path starts at a lower portion of the front side 104 at three points 200, 202, 204. The first point 200 for the first air path is through a front of the switch fabric cards 116. The second point 202 is through a ramp 210 that is part of left side fabric fans 220. Specifically, the ramp 210 at the front side 104 and allows air through to the interface cards 114. Behind the ramp 210 and extending to the rear side 106 are the left side fabric fans 220. The third point 204 is under the fiber manager 134.

The first air path includes interface fans 222 located above the interface cards 114 (shown in FIG. 4). The interface fans 222 create the first air path from the points 200, 202, 204 to exhaust openings 224 on an upper portion of the rear side 106 (shown in FIG. 3). From the points 200, 202, 204, the air is drawn upward by the interface fans 222 through the cage of the interface cards 114 to the exhaust openings 224. In this manner, the airflow for the first air path is confined to the interface cards 114, not the switch fabric cards 116. The second air path starts at a point 230 to the right of the switch fabric cards 116. The point 230 includes perforations for air intake on the right side of the switch fabric cards 116, as well as a filter for dust. The left side fabric fans 220 (shown in FIG. 4) draw the air from the point 230 back through the switch fabric cards 116 to an exhaust opening 232 on the lower rear left on the rear side (shown in FIG. 5). Again, the airflow for the second air path is confined to the switch fabric cards 116 and not the interface cards 114. Advantageously, airflow for both the air paths is front to rear. Note, other embodiments consistent with the first air path and the second air path are also contemplated herein. For example, the second air path is from right to left, but in another embodiment, this could be left to right with the fabric fans 220 located on the right side.

Those of ordinary skill in the art will recognize the platform 100 can include other components which are omitted for illustration purposes, and that the systems and methods described herein are contemplated for use with a plurality of different network elements with the platform 100 presented as an example type of network device or hardware platform. For the high density platform 100, other architectures providing ingress, egress, and switching therebetween are also contemplated for the systems and methods described herein. Those of ordinary skill in the art will recognize the systems and methods can be used for practically any type of network device which includes interface cards 114 on the front faceplate.

Figure 5:
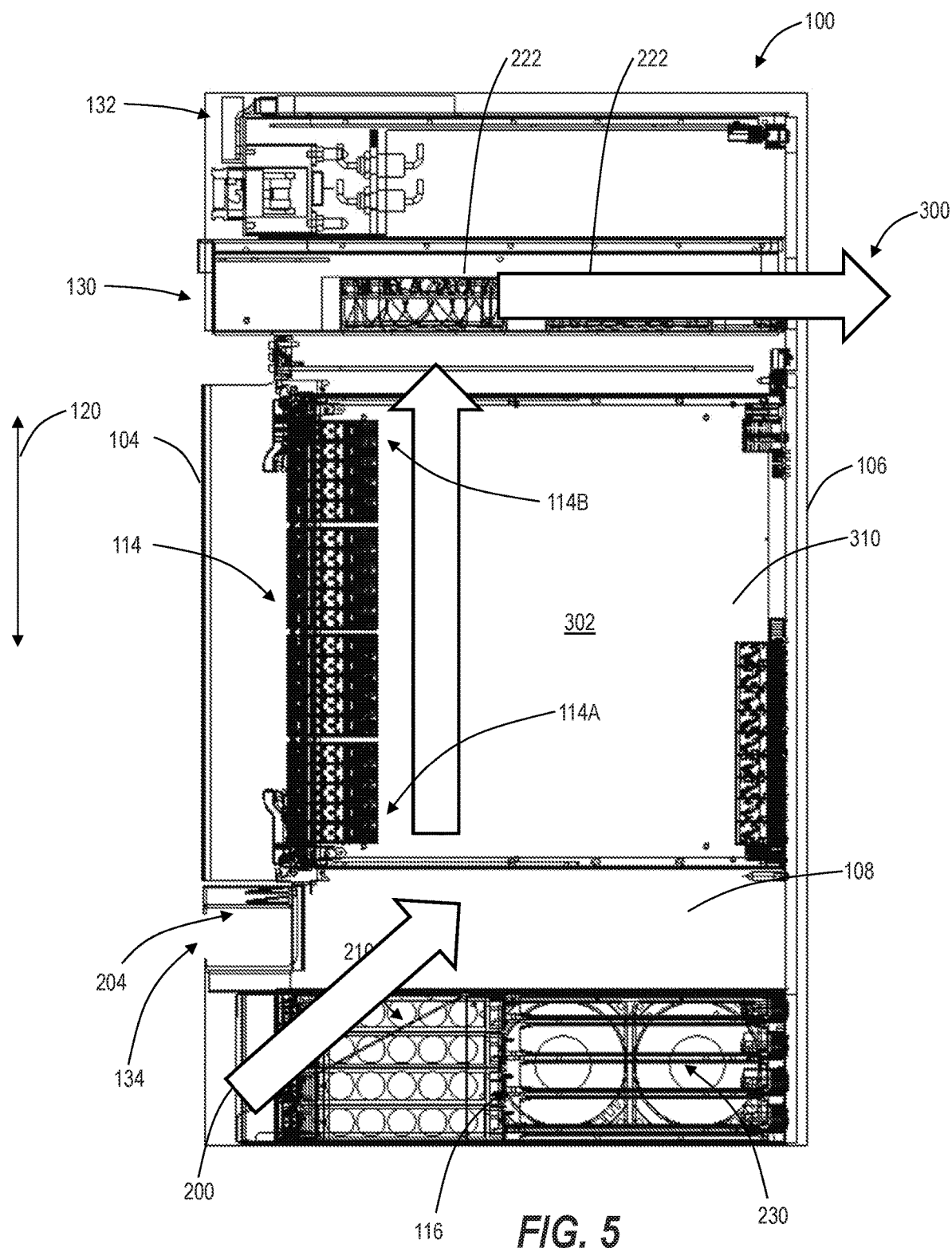
FIG. 5 is a reproduction of FIG. 4 with arrows illustrating airflow over a module having the interface cards with some located upstream of the airflow and some located downstream of the airflow.

FIG. 5 is a reproduction of FIG. 4 with arrows 300 illustrating airflow over a module 302 having the interface cards 114. Of note, in the example platform 100, there are a large number of interface card 114. For example, the platform 100 includes 16 interface cards 114 per slot on the line module 302. Of course, these numbers may vary in different embodiments. Importantly, all of the interface card 114 may not be deployed, even at full capacity and certainly not at intermediate capacity, of the line module 302.

As illustrated in FIG. 5, upstream interface cards 114A receive cooler air than downstream interface cards 114B. This is because air, as indicated by the arrows 300, hits the upstream interface cards 114A first, for cooling, upon ingress into the platform 100. As the airflow proceeds according to the arrows 300, the airflow is heated (taking heat from the components including the upstream interface cards 114A). Thus, the downstream interface cards 114 receive warmer airflow, relative to the upstream interface cards 114A.

Figure 6:
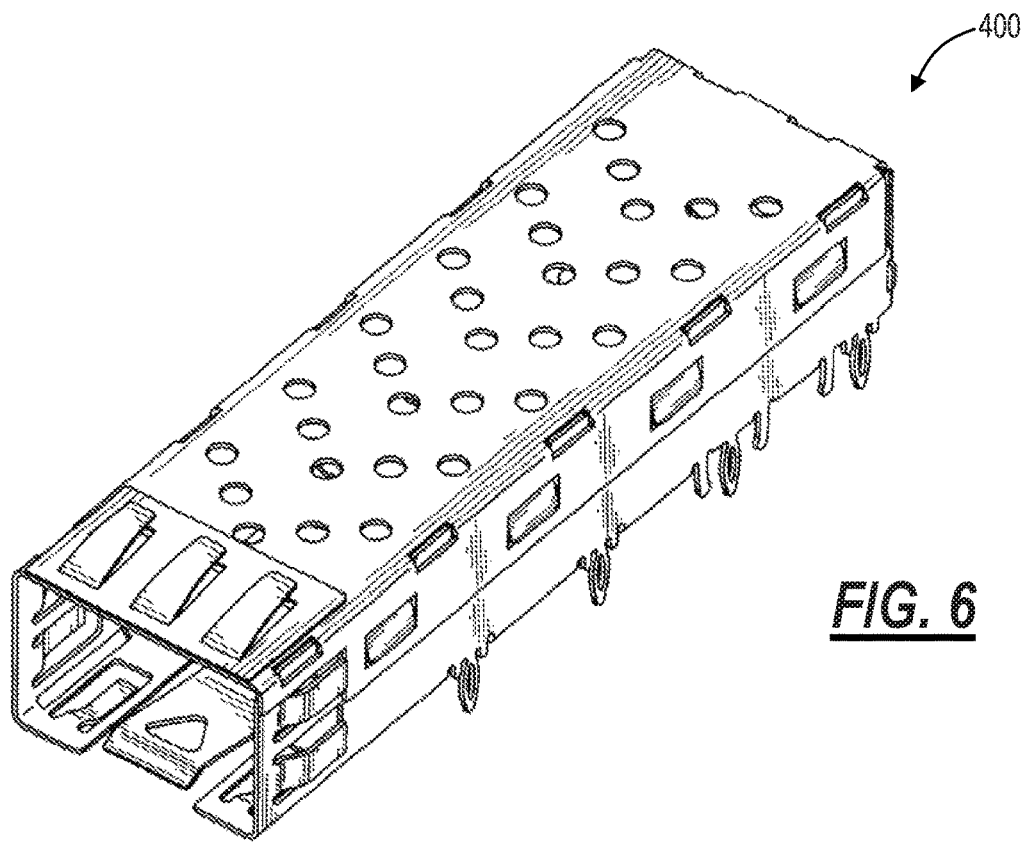
FIG. 6 is a diagram of an example cage for housing an interface card.
Figure 7:
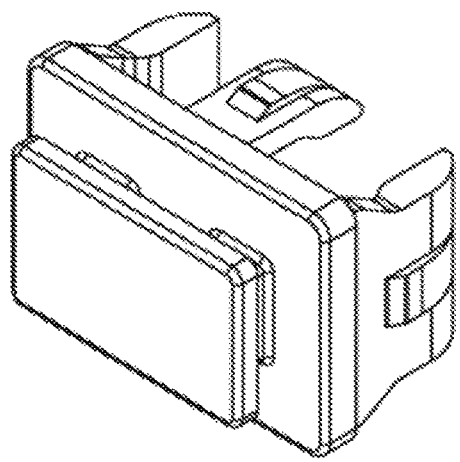
FIG. 7 is a diagram of an example sealing cap for an unequipped cage, as is known in the art.

The interface cards 114 are housed in a cage 400 that can be mounted or attached to the module 302. FIG. 6 is a diagram of an example cage 400 for housing an interface card 114. Thus, the module 302 in FIG. 5 would have 20 of the cages 400 mounted thereon. Of course, other embodiments are contemplated. Conventionally, unequipped cages 400, i.e., without an interface card 114, include a sealing cap 402. FIG. 7 is a diagram of an example sealing cap 402 for an unequipped cage 400, as is known in the art. The sealing cap 402 provides a standards-compliant seal so that air and dust do not enter the interior of the platform 100. Dust protection is required to extend the lifetime of the equipment. To prevent dust, the sealing cap 402 provides a full seal, so no air enters the cage 400 when the interface card 114 is unequipped.

Again, the interface card 114 can be a pluggable optical module, such as QSFP-28 and QSFP-DD. These pluggable optical modules are providing higher capacities and hence are being designed to higher thermal densities. A QSFP-DD is being designed into a size which has evolved from 4 Gb/s modules, with the QSFP-DD carrying up to 400 Gb/s. Sockets that were previously designed for 3.5 W power dissipation are now being designed to accommodate 12-18 W optical modules and as a result, have become increasingly difficult to cool.

As illustrated in FIGS. 1-5, the platform 100 draws cooling air through a filter then across the components on a printed circuit board (PCB) 310 in the module 302. Again, as illustrated in FIG. 5, as the cooling air moves across the PCB 310, it picks up heat from the components it is cooling so the downstream components are cooled by air that can be many degrees above the inlet temperature (at the point 200). The ability of the warmer air to cool downstream components is diminished. As illustrated in FIGS. 6-7, the faceplate is sealed to prevent unfiltered air from entering the card per the requirements in GR-63-CORE.

Increased densities are happening not only on the individual plugs but also on the faceplate. That is, more pluggable optics (interface cards 114) are being located on a faceplate. The upstream interface cards 114A will see the coolest air. The downstream interface cards 114B are cooled with preheated air. As a result, the downstream interface cards 114B require larger heatsinks that the upstream interface cards 114A. This larger space requirement for heatsinks can impact the cooling of other components on the module 302 as less space is available for their heatsinks.

Of note, many modules 302 in the platform 100 mix high power and low power interface cards 114 on a module 302 to provide flexibility on the client-side optics. For instance, there could be a module with 4 cages 400 and only a 4×100G interface card 114 or a single 400G interface card 114; this leaves 3 low power ports empty, and 1 filled high power port.

The platform 100 used in this disclosure is a specific example of where the filtered dust caps can be used. It has 3 levels of "pluggability": The actual line card or blade, i.e., the module 302. The platform 100 can also has pluggable sub-cards (e.g., universal sub-slot modules or USSMs) on some of the modules 302. The pluggable electro-optical modules can be hosted on either module 302 or the USSMs. In another embodiment, which do not have USSMs, there are still pluggable electro-optical modules on the module 302. In some embodiments, air ingress is at the front and air egress is also at the front. The issue of plugs at the upstream edge of the card pre-heating plugs at the downstream section of the card is the same with this airflow.

Figure 8:
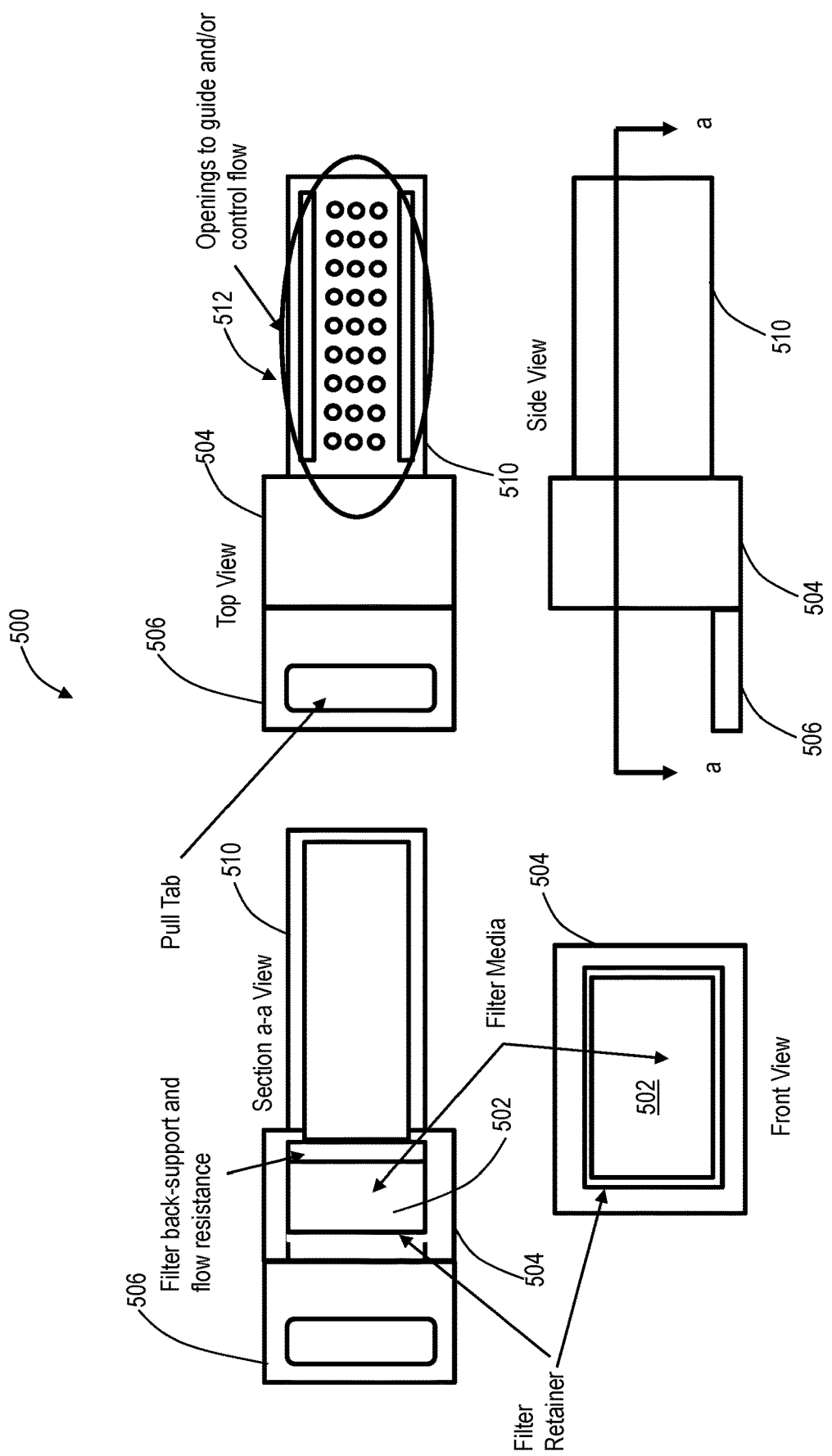
FIG. 8 is a diagram of various views of a filtered dust plug for enabling filtered airflow through a cage when it is unequipped.

FIG. 8 is a diagram of various views of a filtered dust plug 500 for enabling filtered airflow through a cage 400 when it is unequipped. The present disclosure provides a technique for reducing air temperature to downstream interface cards 114 by using filtered dust plugs 500 in the empty cages 400. FIG. 8 includes a front view, a side view, a top view, and a sectional view.

These dust plugs 500 have an air filter medium 502 in a front cover portion 504 as well as the required EMI shielding and would allow cooler air to enter through the faceplate. The filter medium 502 could be customized to allow as little or as much air to enter that port as required. That is, the filter medium 502 can include an electrostatic polypropylene air filter media, an activated carbon air filter media, a polyurethane foam air filter media, a polyester impingement air filter media, and the like.

The dust plugs 500 further include a pull tab 506 for selectively inserting and removing the dust plug 500 from a cage 400. The dust plug 500 can also include a body 510. Of note, the conventional sealing cap 402 is just a cover. The dust plug 500 can include the body 510 that extends within the cage 400 as would an equipped interface card 114. Here, the dust plug 500 extends under a heatsink opening in the cage 400 with similar dimensions to the interface card 114 it replaces. This raises the heatsink and opens a gap for flow around the periphery of the heatsink contact area and the top of the cage 400.

Airflow control can be achieved by adjustment of the gap between the cage and heatsink, the porosity of openings 512 or by adding appropriately sized openings in the filter plug downstream of the air filter. These openings 512 can also be located to direct air where it is most useful for heat removal.

The dust plugs 500 can be made of plastic, metal, combinations, etc. For ease of operation, the dust plugs 500 can be disposable (recyclable). Alternatively, the air filter medium 502 can be field-replaceable. That is, operationally, the dust plugs 500 will need to be replaced on a schedule. In an embodiment, the dust plugs 500 can be replaced on the same schedule as the main filter in the platform 100.

Figure 9:
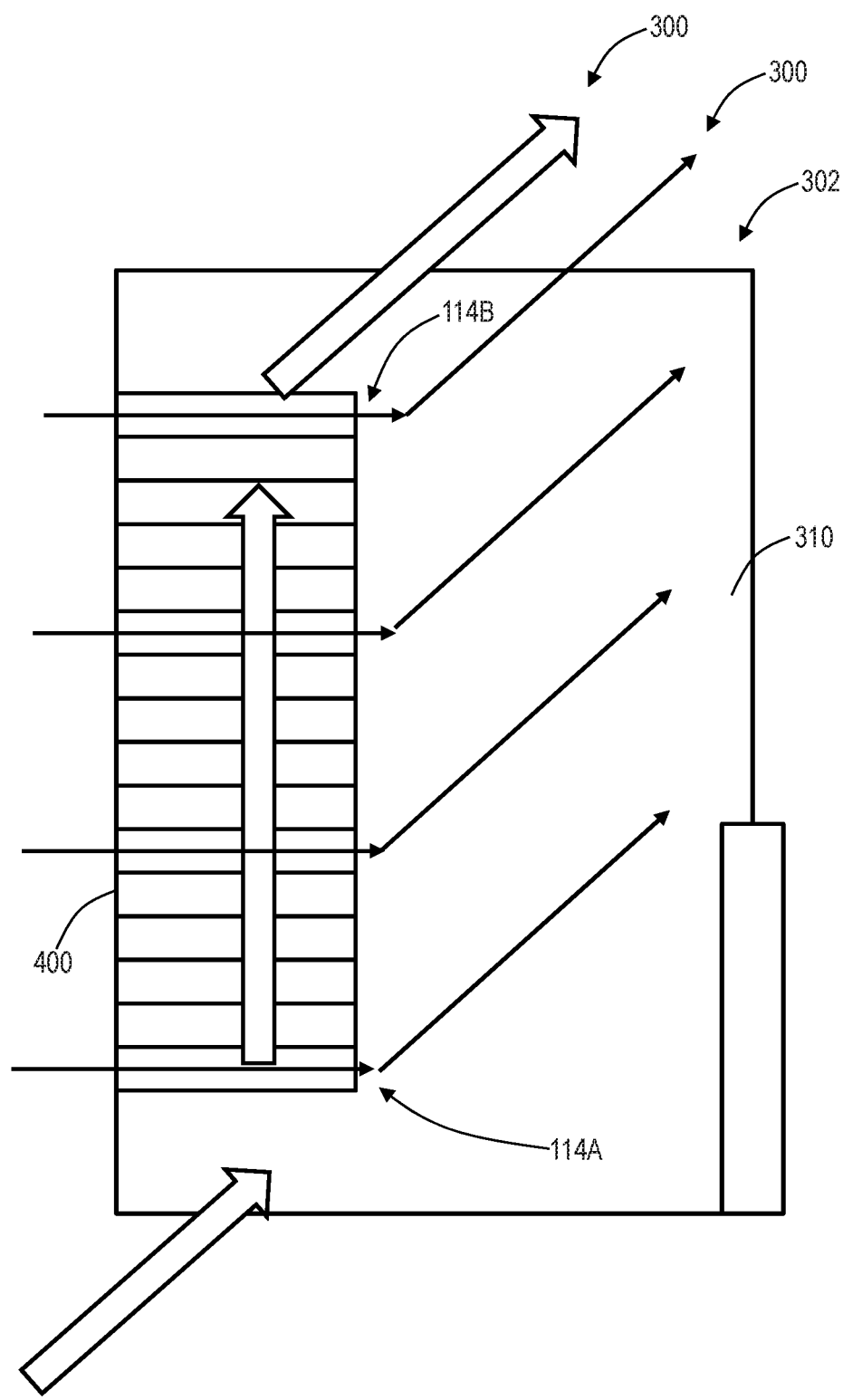
FIG. 9 is a diagram of the module with various cages for interface cards and illustrating airflow (via arrows) utilizing the dust plugs on some or all of the unequipped cages.

FIG. 9 is a diagram of the module 302 with various cages 400 for interface cards and illustrating airflow (via arrows 300) utilizing the dust plugs 500 on some or all of the unequipped cages 400. The cooling units in the platform 100 can be downstream and drawing cooling air across the cages 400 and the interface cards 114A, 114B on the module 302. This puts the air in the module 302 under negative pressure. An opening in the faceplate of the module 302 is a leakage point and would allow unfiltered air to enter the card. As this is not allowed in the GR-63-CORE requirements, introducing a filter in the dust cap 500 would filter the air that is entering through the faceplate due to suction.

In an embodiment, the module 302 and the platform 100 could include deployment rules whereby high power interface cards 114 are deployed in certain locations and low power interface cards 114 are deployed in different locations. For example, client-side optics may be lower power than line-side coherent optics. In an embodiment, the high power interface cards 114 are deployed in upstream locations. In another embodiment, the interface cards 114 may be deployed in an interleaved manner leaving open slots equipped with the dust cap 500. In a further embodiment, the middle section of the interface cards 114 may be equipped last, thereby providing an intermediate airflow intake point. Those of ordinary skill in the art will appreciate various approaches are contemplated and within the scope of the present disclosure.

In an embodiment, the platform 100 includes a housing with a front side, a rear side opposite the front side, a right side adjacent to both the front side and the rear side, and a left side opposite the right side and adjacent to both the front side and the rear side, wherein airflow in the housing is between the front side and the rear side or between the front side and the front side; one or more modules in the housing each including a plurality of cages supporting removable interface cards, wherein the airflow includes an air path that is over the one or more modules between a bottom portion of the one or more modules and a top portion of the one or more modules; and at least one dust cap in one of the plurality of cages, wherein the dust cap includes an air filter medium enabling airflow at an intermediate point of the air path.

The at least one dust cap can include a front cover portion housing the air filter medium; and a body that extends from the front cover portion into the corresponding cage as would an interface card. The body can include a plurality of openings to direct air to a heatsink.

The removable interface cards can be pluggable optical modules. The at least one dust cap can be selectively removable. The at least one dust cap can be replaceable on a schedule that is consistent with a replacement schedule for air filters in the platform.

The interface cards can be deployed in the plurality of cages according to a deployment plan specifying which cages are unequipped with a corresponding dust cap. The deployment plan can include placing high power interface cards in one location of the plurality of cages and low power interface cards at another location of the plurality of cages. The deployment plan can include placing interface cards in every other cage with the at least one dust cap in the other cages.

In a further embodiment, a module system includes a printed circuit board; a plurality of cages disposed on the printed circuit board, wherein each cage supports a removable interface card; wherein the printed circuit board is configured to be inserted or housed in a housing with a front side, a rear side opposite the front side, a right side adjacent to both the front side and the rear side, and a left side opposite the right side and adjacent to both the front side and the rear side, wherein airflow in the housing is between the front side and the rear side; wherein the airflow includes an air path that is over the printed circuit board between a bottom portion of the printed circuit board and a top portion of the printed circuit board; and at least one dust cap in one of the plurality of cages, wherein the dust cap includes an air filter medium enabling airflow at an intermediate point of the air path.

Process for Platform Deployment

Figure 10:
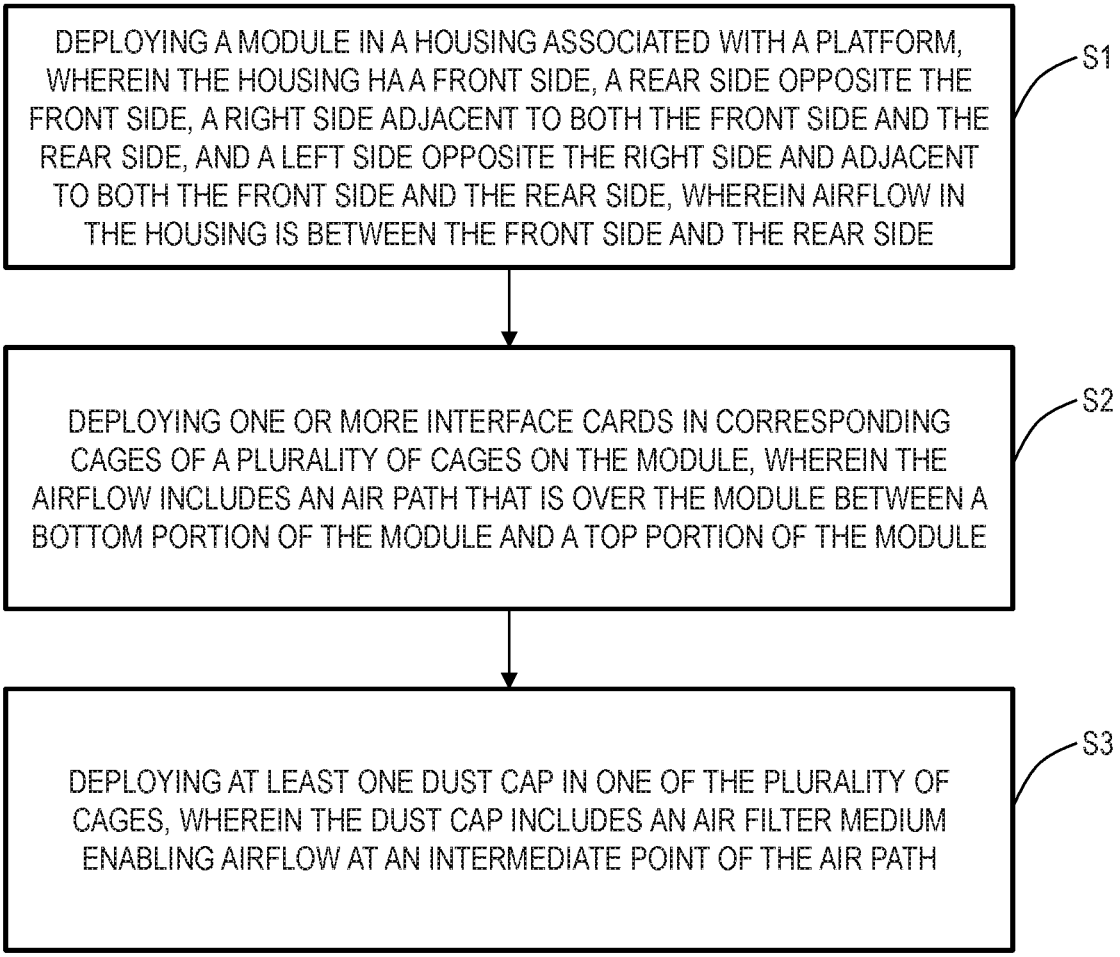
FIG. 10 is a flowchart of a process for platform deployment.

FIG. 10 is a flowchart of a process for platform deployment. The process includes deploying a module in a housing associated with a platform, wherein the housing has a front side, a rear side opposite the front side, a right side adjacent to both the front side and the rear side, and a left side opposite the right side and adjacent to both the front side and the rear side, wherein airflow in the housing is between the front side and the rear side (step S1).

The process further includes deploying one or more interface cards in corresponding cages of a plurality of cages on the module, wherein the airflow includes an air path that is over the module between a bottom portion of the module and a top portion of the module (step S2).

The process further includes deploying at least one dust cap in one of the plurality of cages, wherein the dust cap includes an air filter medium enabling airflow at an intermediate point of the air path (step S3). The process can also include replacing the at least one dust cap with a new dust cap.

Pluggable Heatsink Insert

In another embodiment, the present disclosure includes a pluggable heatsink 560 for use in an unequipped cage. The present disclosure takes advantage of the situations where a high transmission rate plug is used with empty ports adjacent to it. If all the plugs are setup to share a single heatsink as the circuit card, then all plugs are contacting and conducting heat into this heatsink so that air flow over this heatsink can convect the heat away from this source. Taking advantage of the empty ports which occupy a good portion of faceplate space, the present disclosure will use this unused space to assist cooling of occupied ports. This device is a pluggable heatsink, that inserts into these empty ports, through a faceplate, instead of an optical module.

Figure 11:
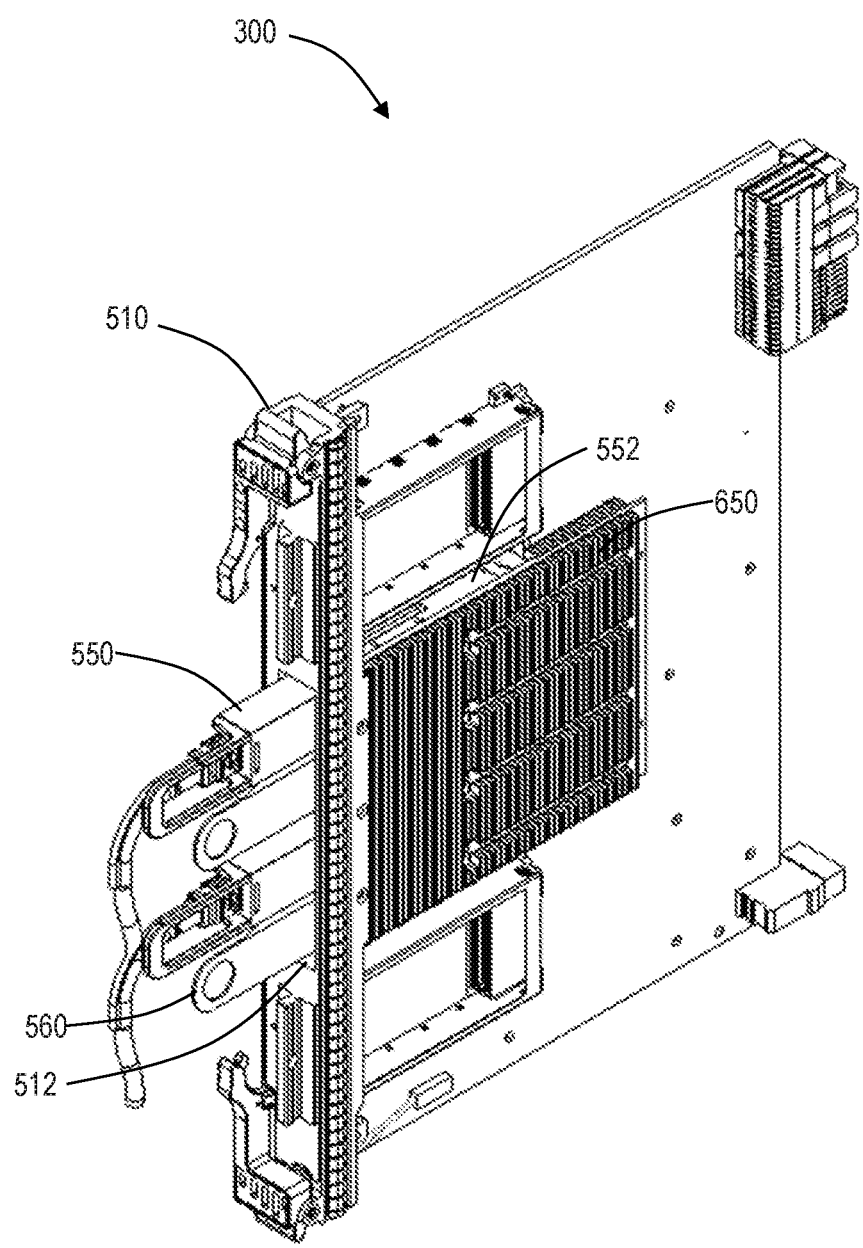
FIG. 11 is a perspective diagram of a module with a shared heat exchanger for multiple pluggable optical modules, and with pluggable heat sinks.

FIG. 11 is a perspective diagram of a module 300 with a shared heat exchanger 650 for multiple pluggable optical modules 550, and with pluggable heatsinks 560. As noted above, where a high transmission rate pluggable optical module 550 is used ports adjacent to it may remain unused and the pluggable optical module 550 can be further cooled by the shared heat exchanger 650. The pluggable heatsinks 560 can be inserted into the empty cages 400 through openings 512 in a faceplate 510, taking advantage of the unused space to assist the cooling of the pluggable optical modules 550 in occupied cages 552.

Figure 12:
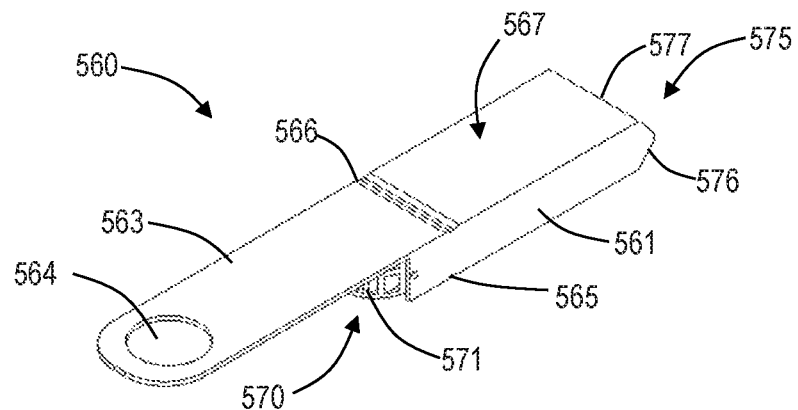
FIG. 12 is a perspective diagram of a pluggable heat sink.
Figure 13:
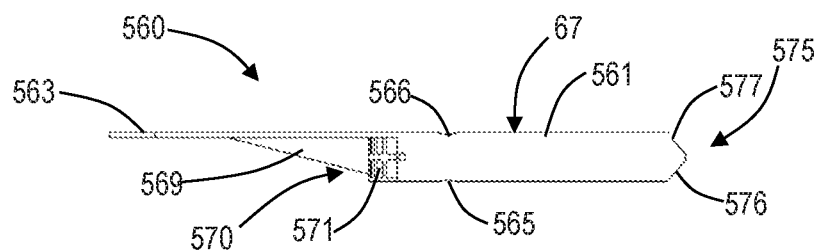
FIG. 13 is a side perspective diagram of the pluggable heat sink of FIG. 12.
Figure 14:
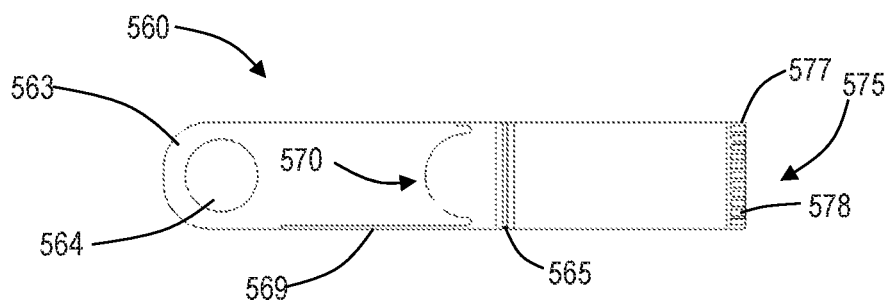
FIG. 14 is a bottom perspective diagram of the pluggable heat sink of FIG. 12.
Figure 15:
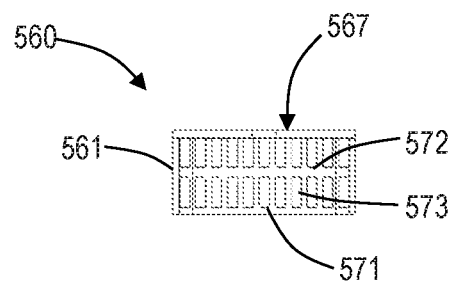
FIG. 15 is a cross-sectional diagram of the pluggable heat sink of FIG. 12.
Figure 16:
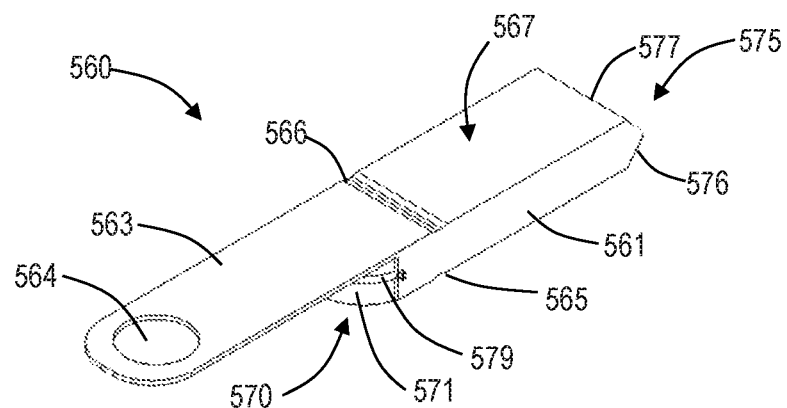
FIG. 16 is a perspective diagram of the pluggable heat sink of FIG. 12 with a removable filter.
Figure 17:
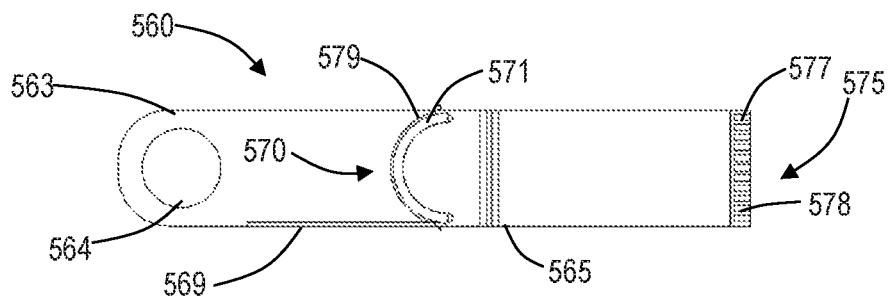
FIG. 17 is a bottom perspective diagram of the pluggable heat sink of FIG. 16.
Figure 18:
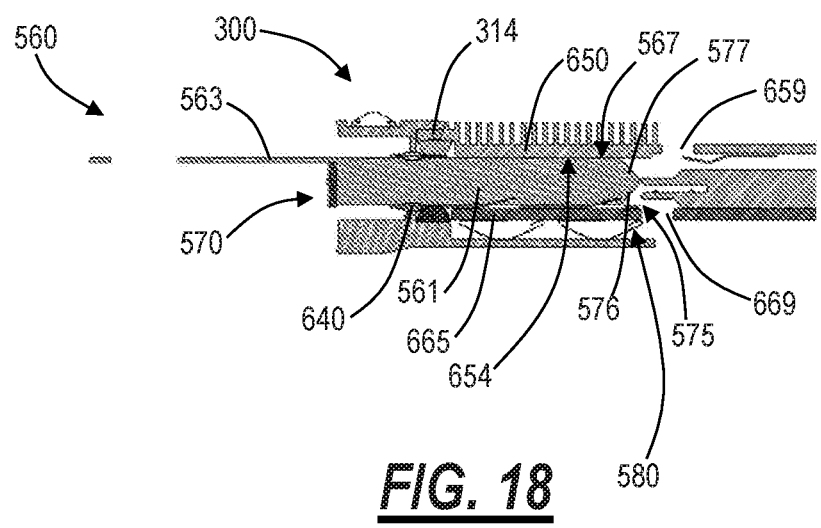
FIG. 18 is a cross-sectional diagram of the module and a pluggable heat sink of FIG. 11.

FIG. 12 is a perspective diagram of a pluggable heatsink 560. FIG. 13 is a side perspective diagram of the pluggable heatsink 560 of FIG. 12. FIG. 14 is a bottom perspective diagram of the pluggable heatsink 560 of FIG. 12. FIG. 15 is a cross-sectional diagram of the pluggable heatsink 560 of FIG. 12. FIG. 16 is a perspective diagram of the pluggable heatsink 560 of FIG. 15 with a removable filter. FIG. 17 is a bottom perspective diagram of the pluggable heatsink 560 of FIG. 15. FIG. 18 is a cross-sectional diagram of the module 300 and pluggable heatsink 560 of FIG. 12.

The pluggable heatsink 560 can include a body 561 and a handle 563. The body 561 can be sized to match the width and height of the pluggable optical modules 550 that it replaces, and can be sized to ensure there is an EMI seal. The body 561 can include a contact surface, an intake end 570 that receives cooling air flowing through the platform, and an exhaust end 575 for expelling the cooling air.

The contact surface 567 can be a flat surface that is configured to contact a mating surface 654 of the heat exchanger 650. The intake end 570 can include a filter 571. The filter 571 can be removable, and can be fastened or otherwise held in place, such as by a clip 579.

The exhaust end 575 can include one or more openings 578 for the cooling air to exit through. The exhaust can also include angled surfaces 576 and 577, which can each include one or more openings 578. The angled surfaces 576 and 577 can form a wedge shape at the exhaust end and can be configured to direct the cooling air at angles relative to a length direction of the body 561. In particular, the one or more openings 578 of angled surface 576 can be configured to direct cooling air at an angle away from the contact surface 567 and the mating surface 654, while the one or more openings 578 of angled surface 577 can be configured to direct cooling air at an angle in an opposing direction, towards the mating surface 654.

The body 561 can also include grooves 565 and 566 that are adjacent the intake end 570. Groove 566 can be positioned on a top of the body 561 adjacent the contact surface 567, and groove 565 can be positioned on a bottom of the body 561 opposite the groove 566. The grooves 565 and 566 can be positioned to meet an apex of internal cage gaskets 640 The grooves 565 and 566 can prevent the pluggable heatsink 560 from walking out of the cage 400.

The body 561 can include one or more passages extending therethrough. The one or more channels can include fins 573 that contact the cooling air for discharging heat from the pluggable heatsink 560 to the cooling air. The fins 573 can also be sized to act like waveguides in the one or more channels to attenuate electro-magnetic noise as it enters or leaves the port. The body can further include a horizontal bar 572 to make the max distance of the channels smaller.

The handle 563 can be formed integrally to the body 561 or can be a separate component attached to the body 561. The handle 563 can extend from the intake end 570 so as to protrude outward from the faceplate 510 when inserted into the module 300. The handle 563 can include a hole 564 or other similar features that can assist in gripping the handle for insertion and removal of the pluggable heatsink 560 into and out of the module 300.

The pluggable heatsink 560 can include one or more brackets 569 further connecting the handle 563 to the body 561 to strengthen the handle 363.

Referring to FIG. 18, when inserted into the module 300, the contact surface 567 mates with the mating surface 654 of the heat exchanger 650. Similar to a pluggable optical module, the one or more springs 580 of the cage assembly press the pluggable heatsink 560 upwards to ensure contact between the contact surface 567 and the mating surface 654 is maximized, thus, minimizing thermal resistance allowing the pluggable heatsink 560 to remove heat from the heat exchanger 650 via conduction and assist in cooling the pluggable optical modules 50.

The first wall 314 can have one or more cooling holes 359 that is positioned downstream of the exhaust end of the pluggable heatsink, and which can be positioned in the heat exchanger 650. Cooling air exiting the one or more openings 578 of angled surface 577 can be directed towards the one or more cooling holes.

A cage PCB 665 can also have one or more cooling holes 669 that is positioned downstream of the exhaust end 575 of the pluggable heatsink 560. Cooling air exiting the one or more openings 578 of angled surface 576 can be directed towards the one or more cooling holes 669.

While angled surfaces 576 and 577 are described herein, other surface configurations are also contemplated, such as a rounded surface with cooling holes, and the like.

A length of the pluggable heatsink 560 can be configured such that there is a gap between the exhaust end 575 and the an optical plug connector of the cage 400 to ensure that the cooling air can exit the exhaust end 575 and flow out of the cooling holes 659 and 669.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A platform comprising:
a housing with a front side, a rear side opposite the front side, a right side adjacent to both the front side and the rear side, and a left side opposite the right side and adjacent to both the front side and the rear side, wherein airflow in the housing is between the front side and the rear side or between the front side and the front side;
one or more modules in the housing each including a plurality of cages supporting removable interface cards, wherein the airflow includes an air path that is over the one or more modules between a bottom portion of the one or more modules and a top portion of the one or more modules; and
a heatsink insert deployed in one of the plurality of cages, the heatsink including a body adapted for airflow to pass therethrough, a front cover portion positioned at an intake end of the body, the front cover housing an air filter medium therein adapted to filter the airflow, and openings formed in the body enabling the airflow to exit the body, wherein the openings of the heatsink insert are formed at an exhaust end of the body distal to the intake end.

2. The platform of claim 1, wherein the body of the heatsink extends from the front cover portion into the corresponding cage as would an interface card.

3. The platform of claim 2, wherein the openings of the heatsink are adapted to direct air towards cooling holes of the housing.

4. The platform of claim 1, wherein the removable interface cards are pluggable optical modules.

5. The platform of claim 1, wherein the heat sink is selectively removable.

6. The platform of claim 5, wherein the heat sink is replaceable on a schedule that is consistent with a replacement schedule for air filters in the platform.

7. The platform of claim 1, wherein the interface cards are deployed in the plurality of cages according to an order specifying which cages are unequipped with a corresponding heat sink based on a given fill of the platform.

8. The platform of claim 7, wherein the order includes placing high power interface cards in one location of the plurality of cages and low power interface cards at another location of the plurality of cages.

9. The platform of claim 7, wherein the order includes placing interface cards in every other cage with a respective heat sink in each of the other cages.

10. The platform of claim 1, wherein the front cover portion is adapted to open for removal and replacement of the air filter medium, and wherein the air filter medium comprises a medium selected from one of an electrostatic polypropylene air filter medium, an activated carbon air filter medium, a polyurethane foam air filter medium, and a polyester impingement air filter medium.

11. A module system comprising:
- a printed circuit board;
- a plurality of cages disposed on the printed circuit board, wherein each cage supports a removable interface card;
- wherein the printed circuit board is configured to be inserted or housed in a housing with a front side, a rear side opposite the front side, a right side adjacent to both the front side and the rear side, and a left side opposite the right side and adjacent to both the front side and the rear side, wherein airflow in the housing is between the front side and the rear side or between the front side and the front side;
- wherein the airflow includes an air path that is over the printed circuit board between a bottom portion of the printed circuit board and atop portion of the printed circuit board; and
- a heatsink insert deployed in one of the plurality of cages, the heatsink including a body adapted for airflow to pass therethrough, a front cover portion positioned at an intake end of the body, the front cover housing an air filter medium therein adapted to filter the airflow, and openings formed in the body enabling the airflow to exit the body, wherein the openings of the heatsink insert are formed at an exhaust end of the body distal to the intake end.

12. The module system of claim 11, wherein the body of the heatsink extends from the front cover portion into the corresponding cage as would an interface card.

13. The module system of claim 12, wherein the openings of the heatsink are adapted to direct air towards cooling holes of the housing.

14. The module system of claim 11, wherein the removable interface card is a pluggable optical module.

15. The module system of claim 11, wherein the heat sink is selectively removable.

16. The module system of claim 11, wherein interface cards are deployed in the plurality of cages according to an order specifying which cages are unequipped with a corresponding heat sink based on a given fill of the platform.

17. The module system of claim 11, wherein the front cover portion is adapted to open for removal and replacement of the air filter medium, and wherein the air filter medium comprises a medium selected from one of an electrostatic polypropylene air filter medium, an activated carbon air filter medium, a polyurethane foam air filter medium, and a polyester impingement air filter medium.

18. A method comprising:
- deploying a module in a housing associated with a platform, wherein the housing has a front side, a rear side opposite the front side, a right side adjacent to both the front side and the rear side, and a left side opposite the right side and adjacent to both the front side and the rear side, wherein airflow in the housing is between the front side and the rear side or between the front side and the front side;
- deploying one or more interface cards in corresponding cages of a plurality of cages on the module, wherein the airflow includes an air path that is over the module between a bottom portion of the module and a top portion of the module; and
- deploying a heatsink insert in one of the plurality of cages, the heatsink including a body adapted for airflow to pass therethrough, a front cover portion positioned at an intake end of the body, the front cover housing an air filter medium therein adapted to filter the airflow, and openings formed in the body enabling the airflow to exit the body, wherein the openings of the heatsink insert are formed at an exhaust end of the body distal to the intake end.

19. The method of claim 18, further comprising replacing the heat sink with one of a new heat sink.

20. The method of claim 18, further comprising:
- replacing the air filter medium by opening the front cover portion, removing the air filter medium, and inserting a new air filter medium,
- wherein the air filter medium comprises a medium selected from one of an electrostatic polypropylene air filter medium, an activated carbon air filter medium, a polyurethane foam air filter medium, and a polyester impingement air filter medium.

\* \* \* \* \*